United States Patent
Jung (10) Patent No.: US 8,785,963 B2
(45) Date of Patent: Jul. 22, 2014

(54) METHOD OF MANUFACTURING SEMICONDUCTOR LIGHT EMITTING DEVICE

(75) Inventor: Joo Yong Jung, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/546,826

(22) Filed: Jul. 11, 2012

(65) Prior Publication Data

US 2012/0273825 A1 Nov. 1, 2012

Related U.S. Application Data

(63) Continuation of application No. 12/706,335, filed on Feb. 16, 2010, now Pat. No. 8,236,581.

(30) Foreign Application Priority Data

Feb. 17, 2009 (KR) ........................ 10-2009-0013171

(51) Int. Cl.
*H01L 33/00* (2010.01)
(52) U.S. Cl.
USPC .......................................................... 257/99
(58) Field of Classification Search
None
See application file for complete search history.

(56) References Cited

U.S. PATENT DOCUMENTS

| | | | |
|---|---|---|---|
| 2003/0164503 A1* | 9/2003 | Chen | 257/79 |
| 2004/0140474 A1 | 7/2004 | Ueda et al. | |
| 2005/0104081 A1* | 5/2005 | Kim et al. | 257/99 |
| 2006/0154389 A1 | 7/2006 | Doan | |
| 2006/0273324 A1 | 12/2006 | Asai et al. | |
| 2007/0228408 A1* | 10/2007 | Asano | 257/103 |
| 2007/0295952 A1 | 12/2007 | Jang et al. | |
| 2008/0048206 A1* | 2/2008 | Lee et al. | 257/103 |
| 2008/0105889 A1 | 5/2008 | Kim et al. | |
| 2008/0142781 A1 | 6/2008 | Lee | |
| 2008/0210969 A1 | 9/2008 | Yuan et al. | |
| 2008/0261378 A1 | 10/2008 | Yao et al. | |
| 2009/0004764 A1 | 1/2009 | Ohnuma et al. | |
| 2009/0283782 A1 | 11/2009 | Shakuda | |
| 2010/0207159 A1 | 8/2010 | Jeong | |

FOREIGN PATENT DOCUMENTS

| | | |
|---|---|---|
| EP | 1998381 A1 | 12/2008 |
| JP | 2002-353506 A | 12/2002 |
| JP | 2002-368273 A | 12/2002 |
| JP | 2005-044954 A | 2/2005 |
| JP | 2009-033138 A | 2/2009 |
| KR | 10-0992657 B1 | 11/2010 |
| WO | WO 2009/002040 A2 | 12/2008 |
| WO | 2009/005477 A | 1/2009 |
| WO | 2009/084860 A2 | 7/2009 |

* cited by examiner

*Primary Examiner* — Charles Garber
*Assistant Examiner* — Andre' C Stevenson
(74) *Attorney, Agent, or Firm* — Birch, Stewart, Kolasch & Birch, LLP (57) ABSTRACT

Disclosed is a light emitting device. The light emitting device includes a light emitting structure including a first conductive semiconductor layer, an active layer on the first conductive semiconductor layer, and a second conductive semiconductor layer on the active layer; an electrode layer on the light emitting structure; and a conductive support member on the electrode; wherein the conductive support member includes a center portion and a circumference portion surrounding the center portion, wherein a thickness of the circumference portion is lower than a thickness of the center portion, and wherein an area of a top surface of the electrode layer is larger than an area of a top surface of the second conductive semiconductor layer.

20 Claims, 7 Drawing Sheets

METHOD OF MANUFACTURING SEMICONDUCTOR LIGHT EMITTING DEVICE

CROSS-REFERENCE TO RELATED APPLICATIONS

This application is a continuation of application Ser. No. 12/706,335 filed on Feb. 16, 2010, now U.S. Pat. No. 8,236,581 which claims priority under 35 U.S.C. §119 of Korean Patent Application No. 10-2009-0013171, filed Feb. 17, 2009, which are hereby incorporated by reference in their entirety.

BACKGROUND

The embodiment relates to a method of manufacturing a semiconductor light emitting device.

Groups III-V nitride semiconductors have been extensively used as main materials for light emitting devices, such as a light emitting diode (LED) or a laser diode (LD), due to the physical and chemical characteristics thereof. For example, the groups III-V nitride semiconductors include a semiconductor material having a compositional formula of $In_xAl_yGa_{1-x-y}N$ ($0 \leq x \leq 1$, $0 \leq y \leq 1$, and $0 \leq x+y \leq 1$).

The LED is a semiconductor device, which transmits/receives signals by converting an electric signal into infrared ray or light using the characteristics of compound semiconductors. The LED is also used as a light source.

The LED or LD using the nitride semiconductor material is mainly used for the light emitting device to provide the light. For instance, the LED or the LD is used as a light source for various products, such as a keypad light emitting part of a cellular phone, an electric signboard, and an illumination device.

SUMMARY

The embodiment provides a method of manufacturing a semiconductor light emitting device capable of improving electrical characteristics.

According to the embodiment, a method of manufacturing a semiconductor light emitting device includes forming a light emitting structure including a first conductive semiconductor layer, an active layer, and a second conductive semiconductor layer on a substrate, forming an electrode layer on the light emitting structure, forming a conductive support member on the electrode layer, and planarizing a top surface of the conductive support member.

According to the embodiment, a method of manufacturing a semiconductor light emitting device includes forming a light emitting structure including a first conductive semiconductor layer, an active layer, and a second conductive semiconductor layer on a substrate, forming a channel layer on an outer peripheral portion of the light emitting structure, forming an electrode layer on the light emitting structure and the channel layer, forming a conductive support member on the electrode layer, and planarizing a top surface of the conductive support member.

The embodiment can improve the electrical characteristics of the semiconductor light emitting device.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings can be exaggerated, omitted or schematically drawn for the purpose of convenience or clarity. In addition, the size of elements does not utterly reflect an actual size.

Hereinafter, the embodiment will be described with reference to accompanying drawings.

Figure 1:
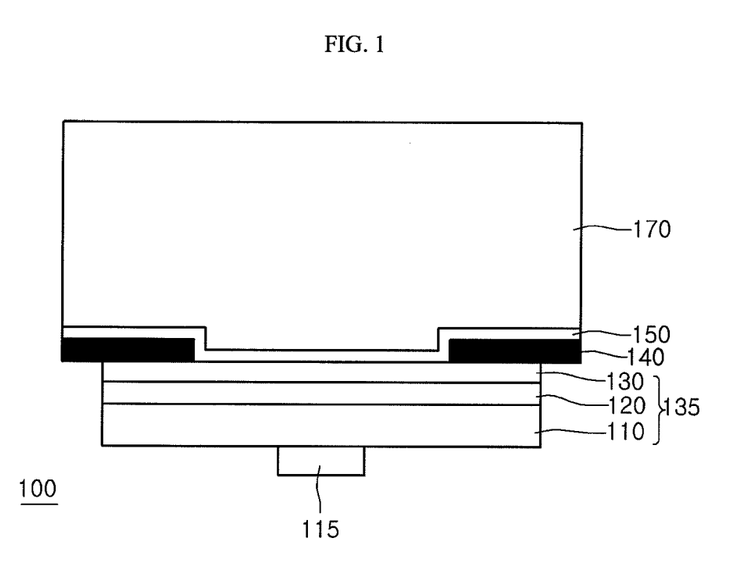
FIG. 1 is a sectional view showing a semiconductor light emitting device according to the embodiment.

FIG. 1 is a sectional view showing a semiconductor light emitting device 100 according to the embodiment.

Referring to FIG. 1, the semiconductor light emitting device 100 includes a first conductive semiconductor layer 110, an active layer 120, a second conductive semiconductor layer 130, a channel layer 140, an electrode layer 150, a conductive support member 170, and a first electrode 115.

The first conductive semiconductor layer 110 may include an N-type semiconductor layer doped with first conductive dopants. For example, the first conductive semiconductor layer 110 may include one of compound semiconductors such as GaN, InN, AlN, InGaN, AlGaN, InAlGaN, and AlInN. The first conductive dopant may be an N-type dopant selected from among Si, Ge, Sn, Se, and Te.

The first electrode 115 having a predetermined pattern may be disposed below the first conductive semiconductor layer 110.

The active layer 120 may be disposed on the first conductive semiconductor layer 110. The active layer 120 may have a single quantum well (SQW) structure or a multiple quantum well (MQW) structure. For example, the active layer 120 may be formed in the SQW structure or the MQW structure at a one cycle of an InGaN well layer/GaN barrier layer. In the active layer 120, the material of a quantum well layer or a quantum barrier layer may be varied depending on a wavelength band of emitted light, but the embodiment is not limited thereto. A clad layer may be formed on and/or below the active layer 120.

The second conductive semiconductor layer 130 may be formed on the active layer 120. The second conductive semiconductor layer 130 may include a P-type semiconductor layer doped with second conductive dopants. The second conductive semiconductor layer 130 may include one of compound semiconductors such as GaN, InN, AlN, InGaN, AlGaN, InAlGaN, and AlInN. The second conductive dopant includes a P-type dopant selected from among Mg, Be, and Zn.

The first conductive semiconductor layer 110, the active layer 120, and the second conductive semiconductor layer 130 may be defined as a light emitting structure. The first conductive semiconductor layer 110 may include a P-type semiconductor layer, and the second conductive semiconductor layer 130 may include an N-type semiconductor layer. Accordingly, the light emitting structure may not only include an N-P junction structure, but include at least one of a P-N junction structure, an N-P-N junction structure, and a P-N-P junction structure.

The channel layer 140 may be disposed below the second conductive semiconductor layer 130. The channel layer 140 may be disposed in the form of a frame on an outer peripheral portion of the second conductive semiconductor layer 130. The channel layer 140 may include an insulating material or a conductive material. The channel layer 140 may include a light transmissive layer. For example, the channel layer 140 may be formed of at least one material selected from among $SiO_2$, $SiO_x$, $SiO_xN_y$, $Si_3N_4$, $Al_2O_3$, $TiO_2$, ITO, IZO, AZO, IZTO, IAZO, IGZO, IGTO, and ATO. According to the embodiment, the channel layer 140 may not be formed.

Since the channel layer 140 is exposed through an isolation etching process in the following mesa etching, the channel layer 140 may be designated as an isolation layer. In addition, since the channel layer 140 serves as an etching stopper in the isolation etching process, the channel layer 140 may be designated as an etching stop layer.

The electrode layer 150 is disposed on the second conductive semiconductor layer 130. The electrode layer 150 may include at least one selected from Al, Ag, Pd, Rh, and Pt or the alloy thereof. In addition, the electrode layer 150 may include a reflective electrode material having an ohmic characteristic. A material having an ohmic characteristic may be disposed in a predetermined pattern between the electrode layer 150 and the second conductive semiconductor layer 130, but the embodiment is not limited thereto.

The conductive support member 170 may be disposed on the electrode layer 150. The conductive support member 170 may include a material such as Cu, Au, Ni, or Mo.

A surface (i.e., top surface) of the conductive support member 170 is planarized. When the conductive support member 170 is bonded to a lead electrode by using a conductive adhesive after the conductive support member 170 has been positioned on a base, the conductive support member 170 can closely adhere to the lead electrode due to the planarized surface, so that electrical reliability can be improved.

FIGS. 2 to 7 are sectional views showing the manufacturing process of the semiconductor light emitting device according to the embodiment.

Figure 2:
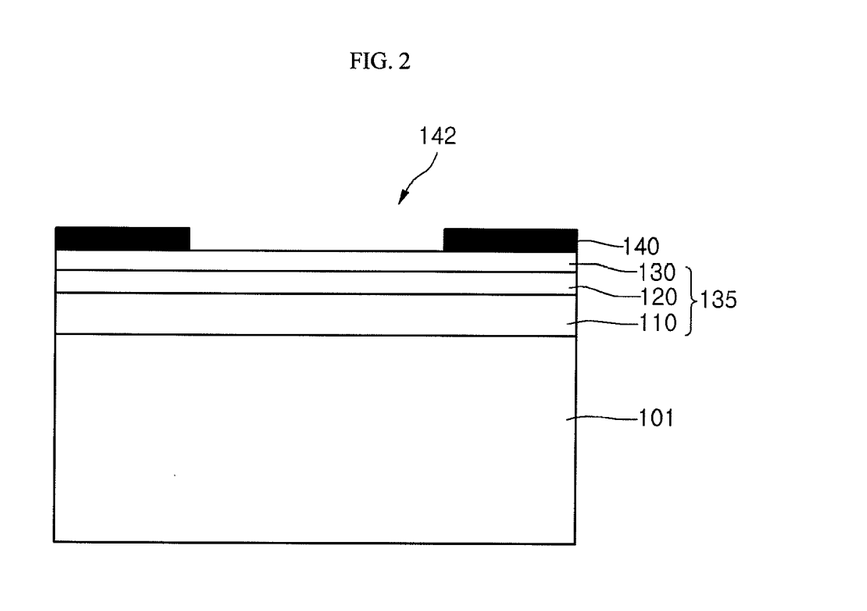
FIGS. 2 to 7 are sectional views showing the manufacturing process of a semiconductor light emitting device according to the embodiment.

Referring to FIG. 2, the first conductive semiconductor layer 110 is formed on a substrate 101. The active layer 120 is formed on the first conductive semiconductor layer 110. The second conductive semiconductor layer 130 is formed on the active layer 120.

The substrate 101 may include one selected from the group consisting of $Al_2O_3$, GaN, SiC, ZnO, Si, GaP, InP, and GaAs. The substrate 101 is formed thereon with a buffer layer and/or undoped semiconductor layer. The buffer layer and/or undoped semiconductor layer may be removed in the manufacturing process of the semiconductor light emitting device thereafter.

A nitride semiconductor may be grown on the substrate 101. The nitride semiconductor may be grown by an electronic beam depositor, physical vapor deposition (PVD), chemical vapor deposition (CVD), plasma laser deposition (PLD), a dual-type thermal evaporator, sputtering, or metal organic chemical vapor deposition (MOCVD), but the embodiment is not limited thereto.

The first conductive semiconductor layer 110 may include an N-type semiconductor layer, and the second conductive semiconductor layer 130 may include a P-type semiconductor layer. The first conductive semiconductor layer 110 may include one of compound semiconductor materials such as GaN, InN, AlN, InGaN, AlGaN, InAlGaN, and AlInN. The first conductive semiconductor layer 110 may be doped with an N-type dopant (e.g., Si, Ge, Sn, Se, or Te). The second conductive semiconductor layer 130 may be doped with a P-type dopant such as Mg or Zn. The second conductive semiconductor layer 130 may include one of compound semiconductor materials such as GaN, InN, AlN, InGaN, AlGaN, InAlGaN, and AlInN.

The first conductive semiconductor layer 110, the active layer 120, and the second conductive semiconductor layer 130 may be defined as the light emitting structure 135. Another semiconductor layer may be formed above and/or below the light emitting structure 135, but the embodiment is not limited thereto. The light emitting structure 135 may include at least one of an N-P junction structure, a P-N junction structure, an N-P-N junction structure, and a P-N-P junction structure.

The channel layer 140 is formed on the second conductive semiconductor layer 130. The channel layer 140 is formed in the form of a frame on an outer peripheral portion of the second conductive semiconductor layer 130 such that an inner region 142 above the second conductive semiconductor layer 130 is open. The channel layer 140 may include at least one of $SiO_2$, $SiO_x$, $SiO_xN_y$, $Si_3N_4$, $Al_2O_3$, $TiO_2$, ITO, IZO, AZO, IZTO, IAZO, IGZO, IGTO, and ATO. The channel layer 140 may be formed in the form of a polygonal frame or a circular frame on the second conductive semiconductor layer 130. The channel layer 140 improves adhesive strength with the second conductive semiconductor layer 130 to minimize delamination. The channel layer 140 may include a light transmissive conductive material or a light transmissive insulating material. If the channel layer 140 includes an insulating material, the gap between the second conductive semiconductor layer 130 and the conductive support member 170 can be widened by the channel layer 140.

Figure 3:
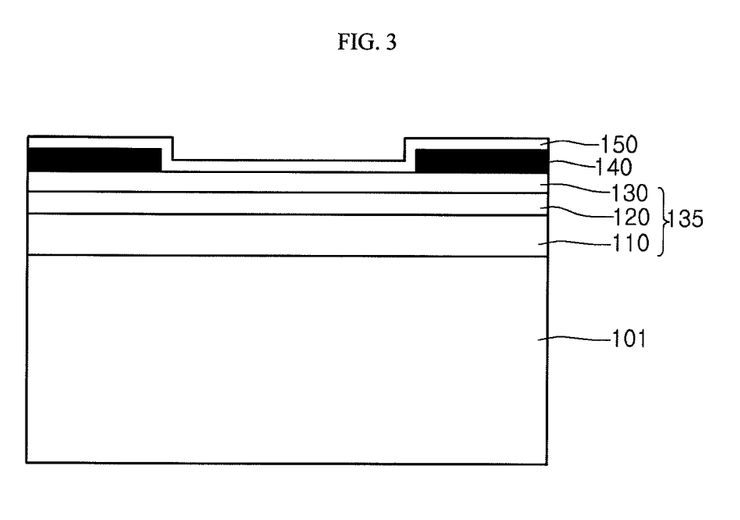

Referring to FIG. 3, the electrode layer 150 may be formed on the second conductive semiconductor layer 130. The electrode layer 150 may include at least one of seed metal, ohmic metal, and reflective metal. The electrode layer 150 may include at least one selected from among Al, Ag, Pd, Rh, and Pt or the alloy thereof, but the embodiment is not limited thereto. The electrode layer 150 may be formed on the second conductive semiconductor layer 130 and the channel layer 140.

Figure 4:
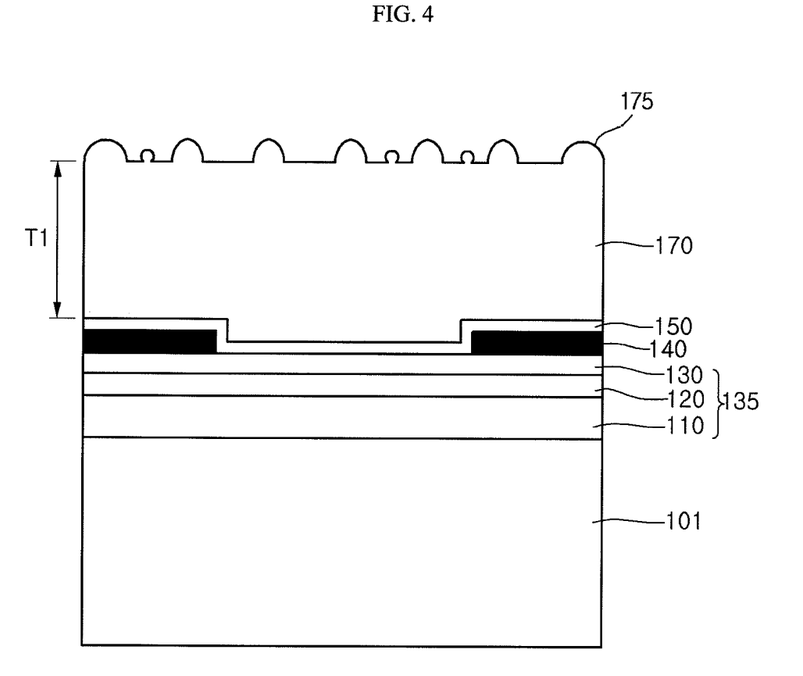
Figure 5:
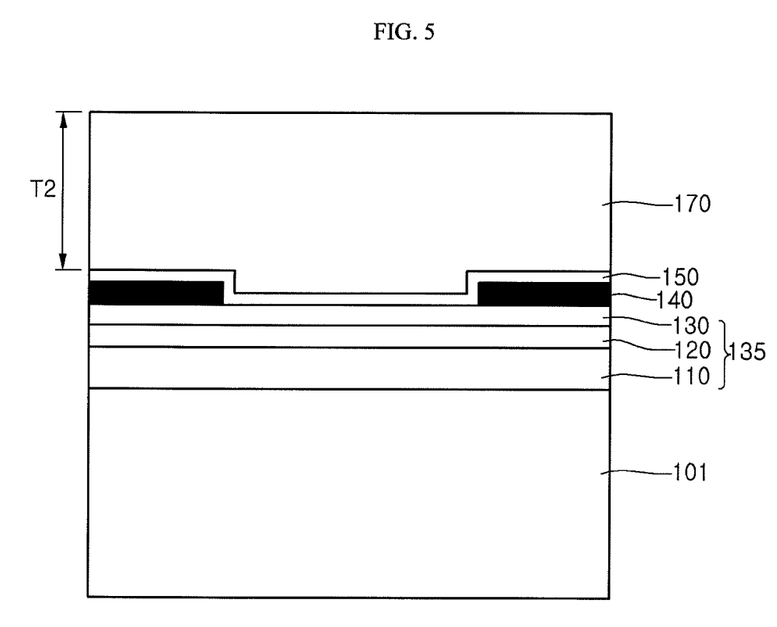

Referring to FIGS. 4 and 5, the conductive support member 170 is formed on the electrode layer 150. The conductive support member 170 may be formed through an electroplating process. The conductive support member 170 may include Cu, Au, Ni, or Mo.

A roughness section 175 is formed on a top surface of the conductive support member 170 after the electroplating process has been performed.

The conductive support member 170 having a thickness of T1 is planarized by cutting or polishing the conductive support member 170 by a predetermined thickness of T2 (T2≤T1), such that the roughness section 175 can be removed.

If the roughness section 175 is formed, the following problems may occur. For example, when placing the conductive support member 170 on a base, stress may be transferred to a compound semiconductor due to the uneven roughness section 175 in a laser lift off (LLO) process. In this case, the wafer may be bent. In addition, if the roughness section 175 is formed on the conductive support member 170, problems may occur in a probe process, a laser scribing process, a breaking process, or a sorting process. Particularly, in the probe process, an exact measurement result cannot be obtained due to the roughness section 175 formed on the conductive support member 170. In this case, the chip reliability may be degraded.

Figure 6:
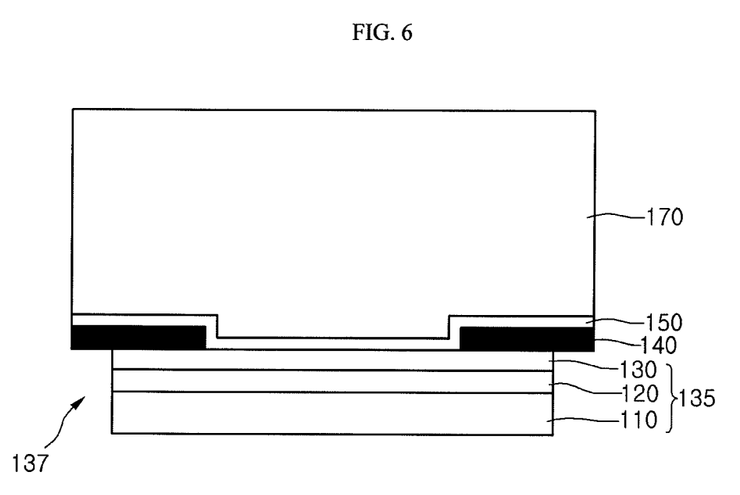

Referring to FIGS. 5 and 6, after the conductive support member 170 has been planarized, the substrate 101 may be removed through a physical and/or chemical removing scheme. For example, the substrate 101 may be removed through the LLO process. In other words, a laser beam having a predetermined wavelength band is irradiated onto the substrate 101 to remove the substrate 101. In addition, if another semiconductor layer (e.g., buffer layer) is formed between the substrate 101 and the first conductive semiconductor layer 110, the buffer layer may be removed by using wet etchant to remove the substrate 101. After the substrate 101 has been removed, the surface of the first conductive semiconductor layer 110 may be polished through an inductively coupled plasma/reactive ion etching (ICP/RIE) scheme.

As shown in FIG. 6, a mesa etching is performed with respect to the boundary region between chips (i.e., channel region) to remove the boundary region, thereby providing individual chips. In this case, the outer portion of the channel layer 140 is exposed by a groove 137 outside the light emitting structure 135.

Figure 7:
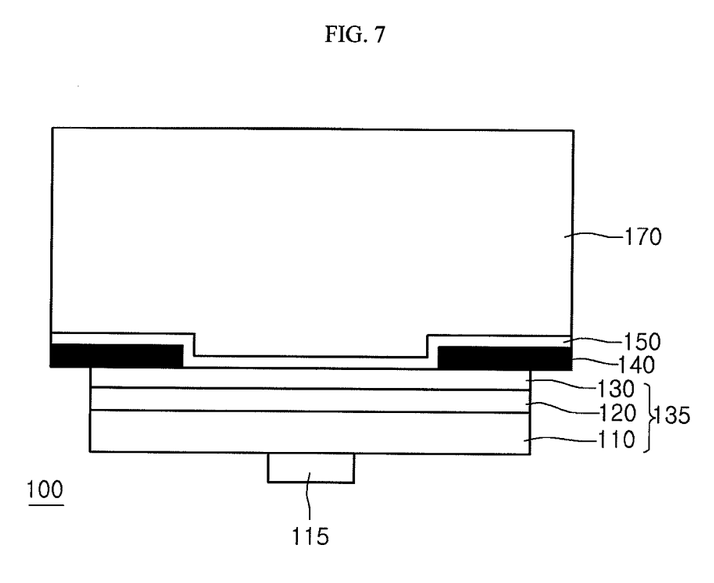

Referring to FIG. 7, the first electrode 115 having a predetermined pattern is formed below the first conductive semiconductor layer 110. The first electrode 115 may be formed after or before the mesa etching is performed or after a chip dicing process is formed.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The embodiment is applicable in the light emitting device for supplying light.

What is claimed is:

1. A light emitting device comprising:
   a light emitting structure including a first conductive semiconductor layer, an active layer on the first conductive semiconductor layer, and a second conductive semiconductor layer on the active layer;
   an electrode layer on the light emitting structure;
   a conductive support member on the electrode layer; and
   a channel layer between the light emitting structure and the electrode layer,
   wherein the conductive support member includes a center portion and a circumference portion surrounding the center portion,
   wherein a thickness of the circumference portion is less than a thickness of the center portion,
   wherein an area of a top surface of the electrode layer is greater than an area of a top surface of the second conductive semiconductor layer,
   wherein a width of the electrode layer is greater than a width of the second conductive semiconductor layer,
   wherein the channel layer is exposed from a side of the light emitting structure, and
   wherein a portion of the electrode layer is disposed between the channel layer and the conductive support member.

2. The light emitting device according to claim 1, further comprising a first electrode under the first conductive semiconductor layer.

3. The light emitting device according to claim 1, wherein the conductive support member includes a material selected from the group consisting of Cu, Au, Ni, and Mo.

4. The light emitting device according to claim 1, wherein the electrode layer includes seed metal.

5. The light emitting device according to claim 1, wherein the electrode layer includes ohmic metal.

6. The light emitting device according to claim 1, wherein the electrode layer includes reflective metal.

7. The light emitting device according to claim 1, wherein the electrode layer includes at least one selected from the group consisting of Al, Ag, Pd, Rh, and Pt, or alloy thereof.

8. A light emitting device comprising:
   a light emitting structure including a first conductive semiconductor layer, an active layer on the first conductive semiconductor layer, and a second conductive semiconductor layer on the active layer;
   an electrode layer on the light emitting structure;
   a conductive support member on the electrode layer; and
   a channel layer on an outer peripheral portion of the second conductive semiconductor layer of the light emitting structure,
   wherein the conductive support member includes a first portion and a second portion,
   wherein the first portion is protruded downwardly from the second portion,
   wherein an area of a top surface of the electrode layer is greater than an area of a top surface of the second conductive semiconductor layer,
   wherein a width of the electrode layer is greater than a width of the second conductive semiconductor layer,
   wherein the channel layer is exposed from a side of the light emitting structure, and
   wherein a portion of the electrode layer is disposed between the channel layer and the conductive support member.

9. The light emitting device according to claim 8, wherein the channel layer is disposed between the second conductive semiconductor layer and the second portion of the conductive support member.

10. The light emitting device according to claim 8, further comprising a first electrode under the first conductive semiconductor layer.

11. The light emitting device according to claim 8, wherein the conductive support member includes a material selected from the group consisting of Cu, Au, Ni, and Mo.

12. The light emitting device according to claim 8, wherein the electrode layer includes seed metal.

13. The light emitting device according to claim 8, wherein the electrode layer includes ohmic metal.

14. The light emitting device according to claim 8, wherein the electrode layer includes reflective metal.

15. The light emitting device according to claim 8, wherein the electrode layer includes at least one selected from the group consisting of Al, Ag, Pd, Rh, and Pt, or alloy thereof.

16. The light emitting device according to claim 8, wherein the channel layer includes at least one selected from the group consisting of $SiO_2$, $SiO_x$, $SiO_xN_y$, $Si_3N_4$, $Al_2O_3$, $TiO_2$, ITO, IZO, AZO, IZTO, IAZO, IGZO, IGTO, and ATO.

17. The light emitting device according to claim 8, wherein the channel layer includes a light transmittive conductive material.

18. The light emitting device according to claim 8, wherein the channel layer includes a light transmittive insulating material.

19. A light emitting device comprising:
- a light emitting structure including a first conductive semiconductor layer, an active layer on the first conductive semiconductor layer, and a second conductive semiconductor layer on the active layer;
- an electrode layer on the light emitting structure;
- a conductive support member on the electrode layer; and
- a channel layer on an outer peripheral portion of the second conductive semiconductor layer of the light emitting structure,
- wherein the channel layer includes at least one selected from the group consisting of ITO, IZO, AZO, IZTO, IAZO, IGZO, IGTO, and ATO,
- wherein a width of the electrode layer is greater than a width of the second conductive semiconductor layer,
- wherein the channel layer is exposed from a side of the light emitting structure, and
- wherein a portion of the electrode layer is disposed between the channel layer and the conductive support member.

20. The light emitting device according to claim 19, wherein the conductive support member includes a center portion and a circumference portion surrounding the center portion,
- wherein a thickness of the circumference portion is less than a thickness of the center portion, and
- wherein an area of a top surface of the electrode layer is greater than an area of a top surface of the second conductive semiconductor layer.

* * * * *